(12) United States Patent
Okamoto et al.

(10) Patent No.: US 10,937,939 B2
(45) Date of Patent: Mar. 2, 2021

(54) THERMOELECTRIC CONVERSION MATERIAL AND THERMOELECTRIC CONVERSION ELEMENT

(71) Applicant: National University Corporation Nagoya University, Nagoya (JP)

(72) Inventors: Yoshihiko Okamoto, Nagoya (JP); Koshi Takenaka, Nagoya (JP); Takumi Inohara, Nagoya (JP); Taichi Wada, Nagoya (JP); Yuma Yoshikawa, Nagoya (JP)

(73) Assignee: National University Corporation Nagoya University, Nagoya (JP)

( * ) Notice: Subject to any disclaimer, the term of this patent is extended or adjusted under 35 U.S.C. 154(b) by 0 days.

(21) Appl. No.: 16/472,985

(22) PCT Filed: Dec. 22, 2017

(86) PCT No.: PCT/JP2017/046218
§ 371 (c)(1),
(2) Date: Jun. 24, 2019

(87) PCT Pub. No.: WO2018/123899
PCT Pub. Date: Jul. 5, 2018

(65) Prior Publication Data
US 2019/0334072 A1    Oct. 31, 2019

(30) Foreign Application Priority Data
Dec. 26, 2016    (JP) .............................. JP2016-251335

(51) Int. Cl.
*H01L 35/16*    (2006.01)
*C01B 33/06*    (2006.01)
(Continued)

(52) U.S. Cl.
CPC .............. *H01L 35/16* (2013.01); *C01B 33/06* (2013.01); *C22C 27/02* (2013.01); *C30B 29/52* (2013.01); *C30B 29/62* (2013.01); *H01L 35/32* (2013.01)

(58) Field of Classification Search
None
See application file for complete search history.

(56) References Cited

U.S. PATENT DOCUMENTS 8,785,762 B2 *    7/2014    Haaβ ...................... C01B 17/20
                                                                    136/238
10,056,536 B2 *    8/2018    Nie ........................ C22C 12/00
(Continued)

FOREIGN PATENT DOCUMENTS

JP    2004-40068 A    2/2004
JP    2009-529799 A    8/2009
(Continued)

OTHER PUBLICATIONS

Inohara et al. "Large Thermoelectric Power Factor at Low Temperature in One-Dimensional Telluride Ta4SiTe4", May 1, 2017, Applied Physics Letters, vol. 110, issue 18, pp. 1-5. (Year: 2017).*
(Continued)

*Primary Examiner* — Telly D Green
(74) *Attorney, Agent, or Firm* — Locke Lord LLP

(57) ABSTRACT

A thermoelectric conversion material according to an embodiment is expressed by the following formula (1):

$$(M^1_{1-x}M^2_x)_4\text{Si}(\text{Te}_{1-y}M^3_y)_4 \quad (1)$$

wherein $M_1$ represents Ta or Nb,
$M^2$ is at least one element selected from a group consisting of elements of groups 4 to 12 in the periodic table,
$M^3$ is at least one element selected from a group consisting of As, Sb, Bi, Sn and Pb,
$0 \leq x < 0.02$, (Continued)

$0 \leq y < 0.02$, and
$M^2$ is an element different from $M^1$ when $0 < x$.

12 Claims, 15 Drawing Sheets

(51) Int. Cl.
  *C22C 27/02* (2006.01)
  *C30B 29/52* (2006.01)
  *C30B 29/62* (2006.01)
  *H01L 35/32* (2006.01)

(56) References Cited

U.S. PATENT DOCUMENTS

| | | | |
|---|---|---|---|
| 10,468,573 B2 * | 11/2019 | Nie | H01L 35/34 |
| 2003/0057512 A1 | 3/2003 | Sterzel et al. | |
| 2010/0139730 A1 | 6/2010 | Bentien et al. | |
| 2012/0001117 A1 | 1/2012 | Haa et al. | |
| 2015/0318460 A1 * | 11/2015 | Suzuki | C22C 21/02 |
| | | | 136/205 |
| 2016/0276564 A1 * | 9/2016 | Nie | C22C 1/0491 |
| 2018/0269369 A1 * | 9/2018 | Nie | H01L 35/10 |

FOREIGN PATENT DOCUMENTS

| | | |
|---|---|---|
| JP | 2012-521648 A | 9/2012 |
| JP | 2016-66795 A | 4/2016 |
| WO | 2007/104601 A2 | 9/2007 |

OTHER PUBLICATIONS

L. R. Testardi et al., "Transport Properties of p-Type Bi2Te3—Sb2Te3 Alloys in the Temperature Range 80-370° K," J. Phys. Chem. Solids, vol. 23, 1962, pp. 1209-1217. (discussed in the spec).

W. M. Yim et al., "Bi—Sb Alloys for Magneto-Thermoelectric and Thermomagnetic Cooling," Solid-State Electronics, vol. 15, 1972, pp. 1141-1165. (discussed in the spec).

D-Y. Chung et al., "CsBi4Te6: A High-Performance Thermoelectric Material for Low-Temperature Applications," Science 287, 2000, pp. 1024-1027. (discussed in the spec).

International Search Report dated Mar. 20, 2018, issued for PCT/JP2017/046218 and English translation thereof.

International Preliminary Report on Patentability dated Jul. 20, 2018, issued for PCT/JP2017/046218 and English translation thereof.

Written Opinion of the International Searching Authority dated Mar. 20, 2018, issued for PCT/JP2017/046218 and English translation thereof.

* cited by examiner

THERMOELECTRIC CONVERSION MATERIAL AND THERMOELECTRIC CONVERSION ELEMENT

BACKGROUND OF THE INVENTION

1. Field of the Invention

The present disclosure relates to a thermoelectric conversion material and a thermoelectric conversion element.

2. Description of the Related Art

Thermoelectric conversion is mutual conversion of thermal and electrical energy using entropy transport by heat transfer electrons in a solid substance. This technology is expected as refrigeration technology for waste heat power generation, environmental power generation, and non-refrigerant. Among them, refrigeration is put to practical use as a thermoelectric cooling element (Peltier element) and is used for local cooling of a CPU, precise temperature control of a laser diode using ultra-high-speed response, and the like.

As thermoelectric conversion materials currently put to practical use in power generation and cooling applications at around room temperature, for example, $Bi_2Te_3$ based materials described in Non-Patent Document 1 are widely known. As candidates for thermoelectric conversion materials that exhibit high performance in a temperature range that is lower than this temperature, the Bi—Sb based material described in Non-Patent Document 2 and $CsBi_4Te_6$ described in Non-Patent Document 3 are known. Among these, the Bi—Sb based material exhibits high performance at around −200° C. as an n-type thermoelectric conversion material. On the other hand, $CsBi_4Te_6$ exhibits high performance at around −50° C., has an operating temperature lower limit of about −100° C., and exhibits high performance when used as a p-type thermoelectric conversion material.

[Non-Patent Document 1] J. Phys. Chem. Solid 23, pp. 1209-1217 (1962)

[Non-Patent Document 2] Solid State Electronics 15, pp. 1141-1165 (1972)

[Non-patent document 3] D-Y. Chung et al., Science 287, pp. 1024-1027 (2000)

A Bi—Sb based thermoelectric conversion material such as the one described in Non-Patent Document 2 has low performance and has not been put to practical use. Furthermore, $CsBi_4Te_6$ used as a p-type thermoelectric conversion material such as the one described in Non-Patent Document 3 shows a significant decrease in performance at −100° C. or below.

SUMMARY OF THE INVENTION

In this background, a purpose of the present disclosure is to provide a new thermoelectric conversion material capable of performing thermoelectric conversion.

A thermoelectric conversion material according to one embodiment of the present disclosure is expressed by the following formula (1):

$$(M^1_{1-x}M^2_x)_4Si(Te_{1-y}M^3_y)_4 \quad (1)$$

wherein $M^1$ represents Ta or Nb, $M^2$ is at least one element selected from a group consisting of elements of groups 4 to 12 in the periodic table, $M^3$ is at least one element selected from a group consisting of As, Sb, Bi, Sn and Pb, $0 \leq x < 0.2$, $0 \leq y < 0.2$, and $M^2$ is an element different from $M^1$ when $0 < x$.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

Figure 1:
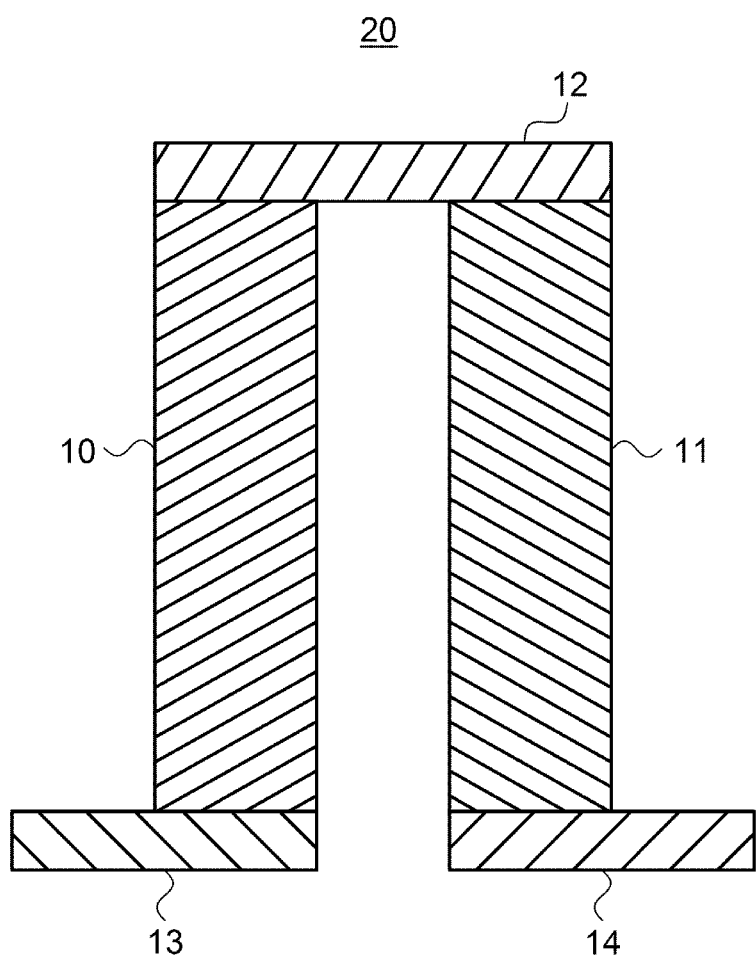
FIG. 1 is a schematic cross-sectional view showing a thermoelectric conversion element according to the present embodiment.

A thermoelectric conversion material according to an embodiment of the present disclosure is expressed by the following formula (1):

$$(M^1_{1-x}M^2_x)_4Si(Te_{1-y}M^3_y)_4 \quad (1)$$

wherein M¹ represents Ta or Nb,
M² is at least one element selected from a group consisting of elements of groups 4 to 12 in the periodic table,
M³ is at least one element selected from a group consisting of As, Sb, Bi, Sn and Pb,
0≤x<0.2,
0≤y<0.2, and
M² is an element different from M¹ when 0<x.

In this case, the performance of the thermoelectric conversion material is evaluated as a dimensionless performance index ZT. The dimensionless figure of merit ZT is expressed by the following equation (2):

$$ZT = S^2 T / \rho \kappa \qquad (2)$$

In the equation, S represents a Seebeck coefficient (thermoelectromotive force), ρ represents electrical resistivity, κ represents thermal conductivity, and T represents the absolute temperature. The higher the ZT value of the thermoelectric conversion material becomes, the higher the thermoelectric conversion efficiency thereof becomes. According to the above equation (2), in order to increase the ZT value, it is required to achieve higher thermoelectromotive force, lower electrical resistivity, and lower thermal conductivity all at once.

Further, a power factor P (unit: μW/cmK²) represented by the following equation (3) is also used to evaluate the performance of the thermoelectric conversion material.

$$P = S^2 / \rho \qquad (3)$$

S represents a Seebeck coefficient (thermoelectromotive force) and ρ represents electrical resistivity in the equation. The larger the value of this power factor P, the larger the output and the better the thermoelectric performance. The thermoelectric conversion material according to the present embodiment is an n-type thermoelectric conversion material, and a high power factor P and high ZT can be obtained in an arbitrary temperature range from around room temperature to −200° C. according to the type of M² and the type of M³ in the above formula (1). Thus, the performance thereof as a thermoelectric conversion material is high.

In the above formula (1), y may be greater than 0, and M³ may represent Sb. Further, M³ may represent Sb, and y may be greater than 0 and smaller than 0.1. Furthermore, the thermoelectromotive force S at 100K of the thermoelectric conversion material according to the present embodiment may be −300 (μV/K) or less, and the power factor may be maximum in the range of 50 to 150 K.

In the above formula (1), x may be greater than 0, and M² may represent Mo or W. Further, M² may be Mo or W, and x may be greater than 0 and smaller than 0.1.

The thermoelectric conversion material may be a single crystal or a polycrystal.

Another embodiment of the present disclosure relates to a thermoelectric conversion element that includes an n-type thermoelectric conversion material and a p-type thermoelectric conversion material, and at least one of the n-type thermoelectric conversion material and the p-type thermoelectric conversion material is the above-described thermoelectric conversion material according to the present disclosure.

Hereinafter, an embodiment for carrying out the present disclosure will be described in detail with reference to the accompanying drawing and the like.

Thermoelectric Conversion Material

The thermoelectric conversion material according to the present embodiment is characterized by being represented by the following formula (1):

$$(M^1_{1-x} M^2_x)_4 Si(Te_{1-y} M^3_y)_4 \qquad (1)$$

wherein M¹ represents Ta or Nb, M² is at least one element selected from a group consisting of elements of groups 4 to 12 in the periodic table, M³ is at least one element selected from a group consisting of As, Sb, Bi, Sn and Pb, 0≤x<0.2, 0≤y<0.2, and M² is an element different from M¹ when 0<x. Regarding the relationship between x and y, 0<x<0.2 and 0≤y<0.2 may be satisfied, or 0≤x<0.2 and 0<y<0.2 may be satisfied.

The element M² is selected from a group consisting of elements of groups 4 to 12 in the periodic table and may be one of the elements or a combination of two or more. Specific examples of the element M² include Ti, Zr, Hf, V, Nb, Ta, Cr, Mo, W, Mn, Re, Fe, Ru, Os, Co, Rh, Ir, Ni, Pd, Pt, Cu, Ag, Au, Zn, Cd and Hg.

The element M³ is selected from a group consisting of As, Sb, Bi, Sn and Pb and may be one of the elements or a combination of two or more.

In a thermoelectric conversion material according to an embodiment, the temperature range in which high performance is exhibited can be changed by substituting a part of the element M¹ or Te in the formula (1) with the element M² or M³. More specifically, the substitution with the element M² allows the peak of the performance of the thermoelectric conversion material, i.e., the dimensionless figure of merit ZT or the power factor P to be shifted to be at a higher temperature. On the other hand, the substitution with the element M³ allows the peak of the performance of the thermoelectric conversion material to be shifted to be at a lower temperature. From the viewpoint of maintaining high thermoelectric performance, content ratios x and y of the elements M² and M³ in a compound of the formula (1) are less than 0.2, preferably less than 0.1. Further, more preferably, x and y are 0.08 or less, 0.05 or less, 0.02 or less, or 0.01 or less, and particularly preferably 0.002 or less.

A thermoelectric conversion material according to an embodiment is preferably expressed by the following formula (1-1):

$$(M^1_{1-x} M^2_x)_4 Si(Te_{1-y} M^3_y)_4 \qquad (1-1)$$

wherein M¹ represents Ta or Nb,
M² represents Mo, W, or Ti,
M³ represents Sb,
0<x<0.1, and
0<y<0.1.

In one embodiment, in the formula (1), it is preferable that y be greater than 0 and M³ represent Sb. By substituting a part of Te of the thermoelectric conversion material of the above formula (1) with Sb, the thermoelectromotive force can be further increased, and, as a result, an n-type thermoelectric conversion material having a higher power factor can be provided. In this embodiment, the thermal electromotive force at 100K is preferably −300 (μV/K) or less and more preferably −400 (μV/K). Further, in this embodiment, it is preferable that the power factor be maximized in the range of 50K to 150K.

In one embodiment, in the formula (1), it is preferable that x be greater than 0 and M² represent Mo or W. By substituting a part of M¹ of the thermoelectric conversion material of the above formula (1) with Mo or W, a thermoelectric conversion material that functions as an n-type thermoelectric conversion material and has a higher power factor can be obtained. More preferably, the thermoelectric conversion material according to this embodiment is expressed by the following formula (1-2):

$$(Ta_{1-x} M^2_x)_4 SiTe_4 \qquad (1-2)$$

wherein $M^2$ represents Mo or W, and
$0<x\leq0.02$.

In one embodiment, in the formula (1), it is preferable that x be greater than 0 and $M^2$ be Ti. By substituting a part of $M^1$ of the thermoelectric conversion material of the formula (1) with Ti, a thermoelectric conversion material that functions as a p-type thermoelectric conversion material can be obtained. From the viewpoint of the size of the power factor, the thermoelectric conversion material according to this embodiment is preferably those expressed by the following formula (1-3):

  (1-3)

wherein x is between 0.01 and 0.08, both inclusive.

The thermoelectric conversion material according to the present embodiment is in a crystalline form. The thermoelectric conversion material may be in the form of a single crystal or a polycrystal. When forming a thermoelectric conversion material in the form of a polycrystal, in order to obtain higher thermoelectric performance, a polycrystal in which crystal orientations are aligned in one direction is preferably used. Further, the shape, size, etc., of the thermoelectric conversion material can be appropriately selected according to the shape of the final product and the desired performance and are not particularly limited. For example, the thermoelectric conversion material can be in the form of a bulk, a thin film, a fine wire, particles, or the like.

The method for producing the thermoelectric conversion material according to the present embodiment is not particularly limited and can be produced by methods known to those skilled in the art. For example, a single crystal thermoelectric conversion material can be produced by mixing and firing elements used as the raw materials so as to achieve the element ratio of the target material. When producing a polycrystalline thermoelectric conversion material, the production can be realized by mixing, compacting, and sintering single crystals thus obtained.

Thermoelectric Conversion Element

The thermoelectric conversion element according to the present embodiment includes an n-type thermoelectric conversion material and a p-type thermoelectric conversion material, and at least one of the n-type thermoelectric conversion material and the p-type thermoelectric conversion material is the thermoelectric conversion material according to the embodiment described above. The thermoelectric conversion material according to the embodiment described above functions as either an n-type thermoelectric conversion material or a p-type thermoelectric conversion material depending on the type of the element $M^2$ in the formula (1). A thermoelectric conversion element of an embodiment can include the thermoelectric conversion material according to the embodiment described above that functions as an n-type thermoelectric conversion material and the thermoelectric conversion material according to the embodiment described above that functions as a p-type thermoelectric conversion material. A thermoelectric conversion element of another embodiment can include the thermoelectric conversion material according to the embodiment described above that functions as an n-type thermoelectric conversion material and a known p-type thermoelectric conversion material. A thermoelectric conversion element of still another embodiment can include a known n-type thermoelectric conversion material and the thermoelectric conversion material according to the embodiment described above that functions as a p-type thermoelectric conversion material. As a known p-type thermoelectric conversion material and a known n-type thermoelectric conversion material, for example, $Bi_2Te_3$ based materials or the like can be used. The shapes of the n-type thermoelectric conversion material and the p-type thermoelectric conversion material are not particularly limited, and those known in the art can be used.

A known structure can be used for the structure of the thermoelectric conversion element according to the present embodiment. The structure is not particularly limited and can include, for example, the structure shown in FIG. 1. In FIG. 1, in the thermoelectric conversion element 20, an n-type thermoelectric conversion material 10 and a p-type thermoelectric conversion material 11 are arranged in parallel, and one end of the n-type thermoelectric conversion material 10 and one end of the p-type thermoelectric conversion material 11 are connected via an electrode 12. An electrode 13 is arranged at the other end of the n-type thermoelectric conversion material 10, and an electrode 14 is arranged at the other end of the p-type thermoelectric conversion material 11. When a power supply (not shown) is connected between the electrodes 13 and 14 via a conducting wire (not shown) and an electrical current is applied, heat absorption occurs on the side where the electrode 12 is located, and cooling can be performed. As the electrodes 12, 13, and 14, electrodes known in the field of thermoelectric conversion elements can be used. The thermoelectric conversion element according to the present embodiment can show high performance in cooling in an arbitrary temperature range from around room temperature to around $-200°$ C. at maximum depending on the types of n-type thermoelectric conversion material and p-type thermoelectric conversion material to be combined and can be suitably used as a Peltier element for cooling.

The thermoelectric conversion element according to the present embodiment can be suitably used for cooling of a superconducting element in which a high temperature superconductor usable near the liquid nitrogen temperature (77K) is used such as, for example, a quantum infrared sensor used near 100K, a superconducting quantum interference device (SQUID), etc. Cooling using the thermoelectric conversion element according to the present embodiment allows these sensors and elements to be significantly reduced in size and to have a long life. In these sensors and elements, a plurality of thermoelectric conversion elements are generally used to cool the temperature from room temperature to a target low temperature. For all of the thermoelectric conversion materials of the plurality of thermoelectric conversion elements, one type of the thermoelectric conversion materials according to the above-described embodiments may be used or a plurality of types of thermoelectric conversion materials according to the above-described embodiments that have different composition may be used in combination. Further, one or more types of the thermoelectric conversion materials according to the above-described embodiments may be used for some of the thermoelectric conversion materials of the plurality of thermoelectric conversion elements, and, for example, known $Bi_2Te_3$ based materials may be used for other thermoelectric conversion materials. When using a plurality of thermoelectric conversion elements in this manner, thermoelectric conversion elements that exhibit high performance at a lower temperature are preferably arranged toward the lowest temperature part.

Hereinafter, the present embodiment will be described in more detail using exemplary embodiments. However, these exemplary embodiments do not limit the present disclosure.

EXEMPLARY EMBODIMENTS

First Exemplary Embodiment (Production of $Ta_4SiTe_4$ single crystal)

Ta, Si, and Te were weighed so as to achieve a total of 1 g at a molar ratio of Ta:Si:Te=2:1:2 (a two-fold excess of Si). Further, 10 mg of $TeCl_4$ (promoting a chemical reaction) was added, followed by mixing in a nitrogen atmosphere glove box and vacuum tube sealing in quartz glass (with a degree of vacuum of $-10^{-3}$ Pa) by an oil diffusion pump. A sealed quartz tube in which the weighed sample was sealed was placed in an electric furnace, and the temperature was first raised to 600° C. in 6 hours and then maintained for 24 hours. Subsequently, the temperature was raised to 1150° C. and maintained for 96 hours. Thereafter, the sample was furnace cooled to the room temperature in 5 hours. A whisker-like single crystal was removed from the sample that was obtained.

Exemplary Embodiments 2 to 9, 19 to 21

Single crystal samples according to the exemplary embodiments 2 to 7 were produced in the same manner as in the exemplary embodiment 1 except that substitution with Mo, W, Ti, or Sb was performed on $Ta_4SiTe_4$. More specifically, when the composition of each sample is described as $(Ta_{1-x}M^2{}_x)_4Si(Te_{1-y}Sb_y)_4$ (where $M^2$ represents Mo, W, or Ti), the raw materials were weighed at a molar ratio of Ta:$M^2$:Si:Te:Sb=2−2x:2x:1:2−2y:2y. The composition of the samples according to the exemplary embodiments 2 to 7 are as follows.

Exemplary Embodiment 2: $(Ta_{0.998}Mo_{0.002})_4SiTe_4$
Exemplary Embodiment 3: $(Ta_{0.99}Mo_{0.01})_4SiTe_4$
Exemplary Embodiment 4: $(Ta_{0.98}Mo_{0.02})_4SiTe_4$
Exemplary Embodiment 5: $(Ta_{0.95}Mo_{0.05})_4SiTe_4$
Exemplary Embodiment 6: $(Ta_{0.9}Mo_{0.1})_4SiTe_4$
Exemplary Embodiment 7: $(Ta_{0.95}W_{0.05})_4SiTe_4$
Exemplary Embodiment 8: $Ta_4Si(Te_{0.95}Sb_{0.05})_4$
Exemplary Embodiment 9: $Ta_4Si(Te_{0.98}Sb_{0.02})_4$
Exemplary Embodiment 19: $(Ta_{0.99}Ti_{0.01})_4SiTe_4$
Exemplary Embodiment 20: $(Ta_{0.97}Ti_{0.03})_4SiTe_4$
Exemplary Embodiment 21: $(Ta_{0.95}Ti_{0.05})_4SiTe_4$

Exemplary Embodiment 10

(Production of $Nb_4SiTe_4$ Single Crystal)

Nb, Si, and Te were weighed so as to achieve a total of 1 g at a molar ratio of Nb:Si:Te=2:1:2 (a two-fold excess of Si). Further, 10 mg of $TeCl_4$ (promoting a chemical reaction) was added, followed by mixing in a nitrogen atmosphere glove box and vacuum tube sealing in quartz glass (with a degree of vacuum of $-10^{-3}$ Pa) by an oil diffusion pump. A sealed quartz tube in which the weighed sample was sealed was placed in an electric furnace, and the temperature was first raised to 600° C. in 6 hours and then maintained for 24 hours. Subsequently, the temperature was raised to 1100° C. and maintained for 96 hours. Thereafter, the sample was furnace cooled to the room temperature in 5 hours. A whisker-like single crystal was removed from the sample that was obtained.

Exemplary Embodiments 11 to 18

Single crystal samples according to the exemplary embodiments 9 and 10 were produced in the same manner as in the exemplary embodiment 8 except that substitution with Mo, Ti, or Sb was performed on $Nb_4SiTe_4$. More specifically, when the composition of each sample is described as $(Nb_{1-x}M^2{}_x)_4Si(Te_{1-y}Sb_y)_4$ (where $M^2$ represents Mo or Ti), the raw materials were weighed at a molar ratio of Nb:$M^2$:Si:Te:Sb=2−2x:2x:1:2−2y:2y. The composition of the samples according to the exemplary embodiments 11 to 18 are as follows.

Exemplary Embodiment 11: $(Nb_{0.98}Mo_{0.02})_4SiTe_4$
Exemplary Embodiment 12: $Nb_4Si(Te_{0.98}Sb_{0.02})_4$
Exemplary Embodiment 13: $(Nb_{0.998}Ti_{0.002})_4SiTe_4$
Exemplary Embodiment 14: $(Nb_{0.99}Ti_{0.005})_4SiTe_4$
Exemplary Embodiment 15: $(Nb_{0.99}Ti_{0.01})_4SiTe_4$
Exemplary Embodiment 16: $(Nb_{0.98}Ti_{0.02})_4SiTe_4$
Exemplary Embodiment 17: $(Nb_{0.95}Ti_{0.05})_4SiTe_4$
Exemplary Embodiment 18: $(Nb_{0.92}Ti_{0.08})_4SiTe_4$

Exemplary Embodiment 22

(Production of $Ta_4SiTe_4$ Sintered Compact Sample)

Ta, Si, and Te were weighed such that the molar ratio of Ta:Si:Te was 4:1.1:4. The raw materials that were mixed were tube sealed in quartz glass together with Ar gas of about 0.04 to 0.05 MPa.

The first firing was performed as follows. The weighed sample was heated to 1050° C. in 24 hours using an electric furnace, and the temperature was maintained for 48 hours. Thereafter, the sample was furnace cooled for 3.5 hours.

The sample removed from a sealed quartz tube was mixed and powder-compacted under a pressure of about 8 MPa. A pellet that was obtained was sealed in quartz glass together with Ar gas of about 0.04 to 0.05 MPa. A quartz glass tube in which the sample was sealed was heated to 900° C. in 3 hours using an electric furnace, and the temperature was maintained for 3 hours. Thereafter, a sintered compact sample according to the exemplary embodiment 22 was obtained by furnace cooling for 3.5 hours.

Exemplary Embodiment 23

A sintered compact sample (composition: $(Ta_{0.95}Mo_{0.05})_4SiTe_4$) according to the exemplary embodiment 23 was produced in the same manner as in the exemplary embodiment 22 except that the raw materials were weighed such that the Ta:Mo:Si:Te molar ratio was 4−4×0.05:4×0.05:1.1:4.

Exemplary Embodiment 24

A sintered body sample (composition: $Nb_4SiTe_4$) according to the exemplary embodiment 24 was produced in the same manner as in exemplary embodiment 22 except that the raw materials were weighed such that the Nb:Si:Te molar ratio was 4:1:4.

The electrical resistivity and the thermoelectromotive force were measured for the single crystal samples according to the exemplary embodiments 1 to 21 that were obtained. Further, the electrical resistivity, the thermoelectromotive force, and the thermal conductivity were measured for the sintered compact samples according to the exemplary embodiments 22 to 24. The electrical resistivity was measured in accordance with the direct current four-probe method using a commercially available device (Physical Properties Measurement System manufactured by Quantum Design, Inc.) or a self-made device. The thermoelectromotive force was measured in accordance with the steady state method using a commercially available device (Physical Properties Measurement System manufactured by Quantum Design, Inc.) or a self-made device. The thermal conductivity was measured using a self-made device in accordance with the steady state method.

Power factors were obtained for the samples according to the exemplary embodiments 1 to 24 using the above-mentioned equation (3) based on measured values that were obtained. Further, for the sintered compact samples according to the exemplary embodiments 22 to 24, the dimensionless figure of merit ZT was obtained using the above-mentioned equation (2) based on measured values that were obtained. These results are shown in FIGS. 2-15.

Figure 2:
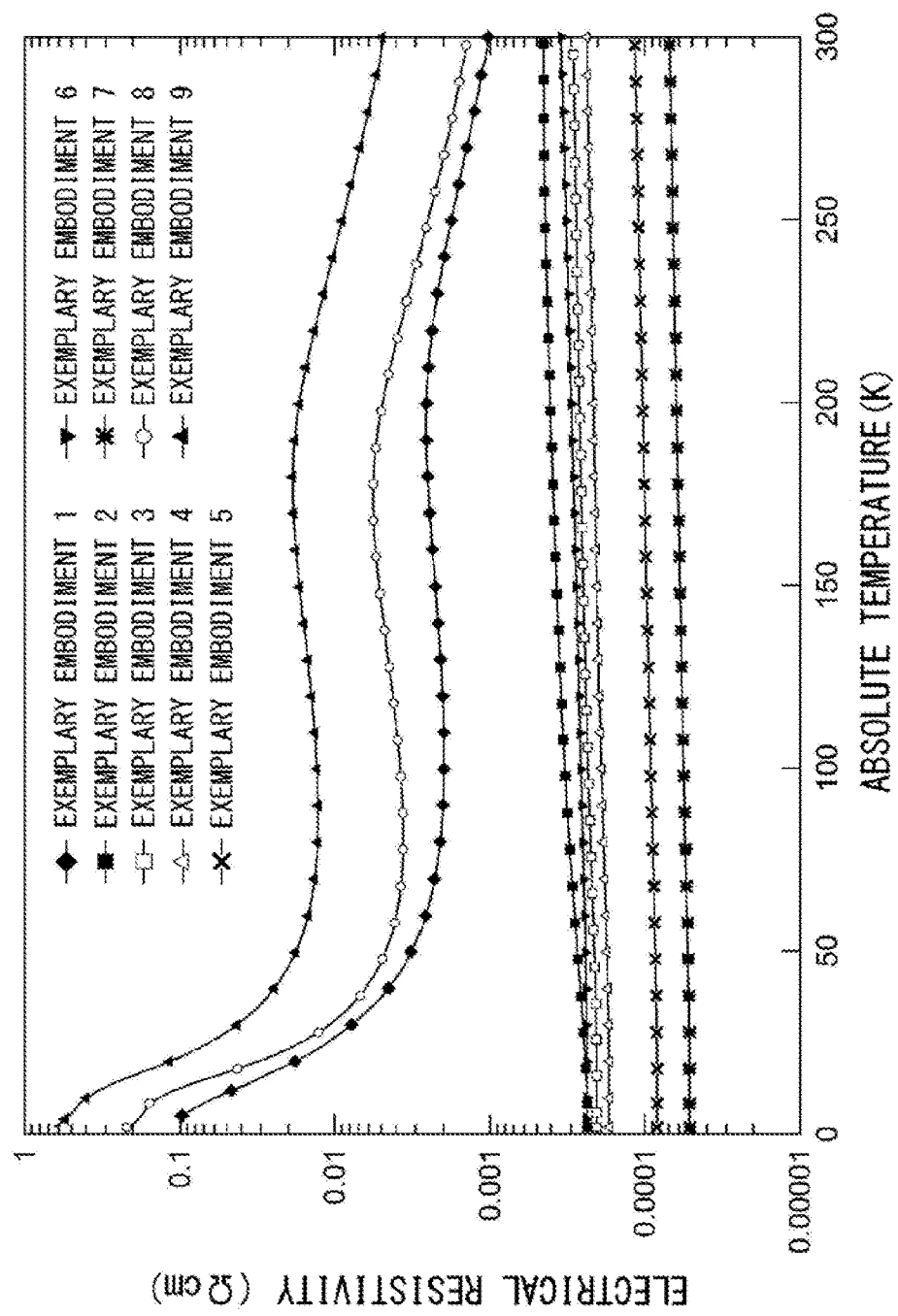
FIG. 2 is a graph showing the electrical resistivity of single crystal samples according to exemplary embodiments 1 to 9.
Figure 3:
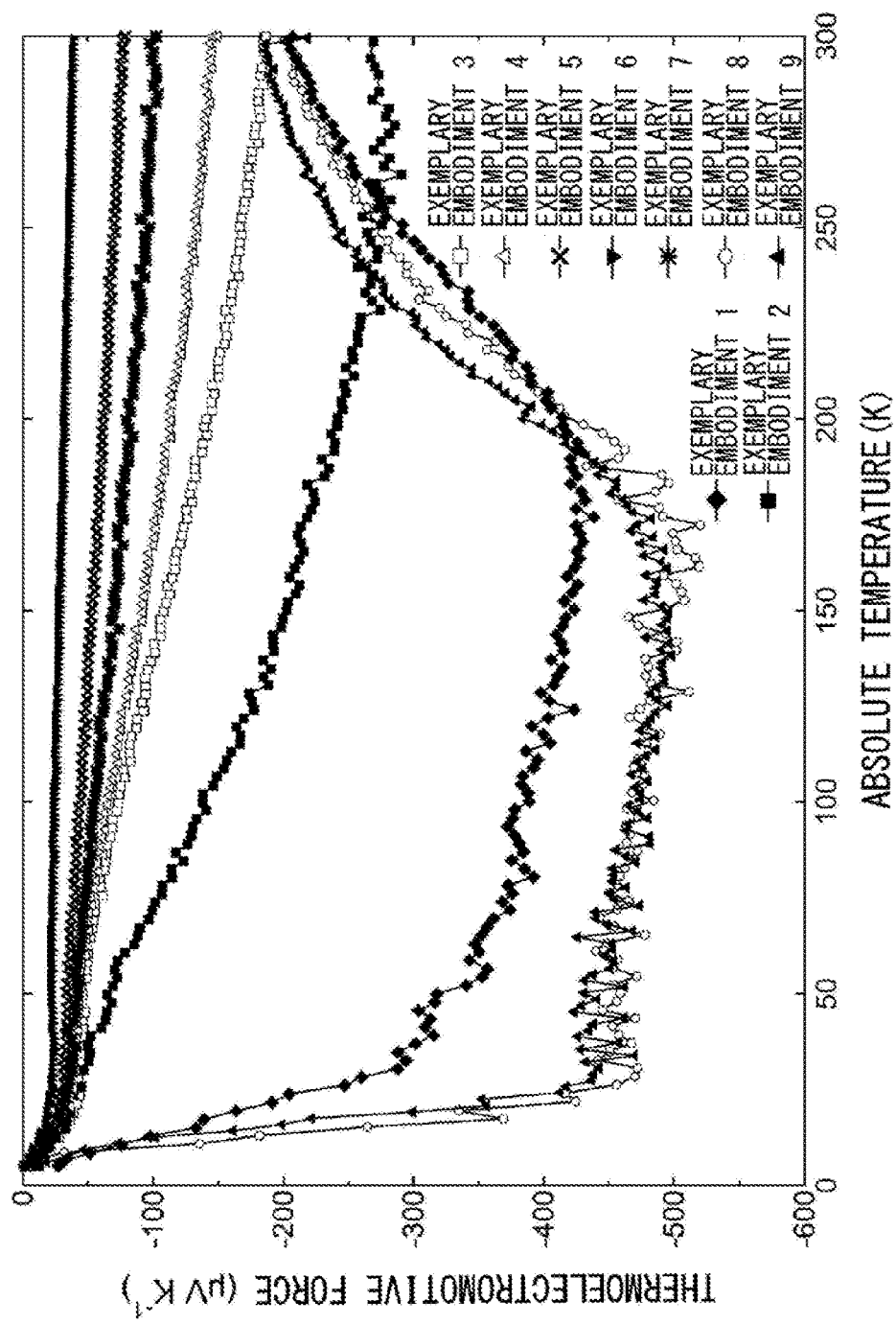
FIG. 3 is a graph showing the thermoelectromotive force of the single crystal samples according to the exemplary embodiments 1 to 9.
Figure 4:
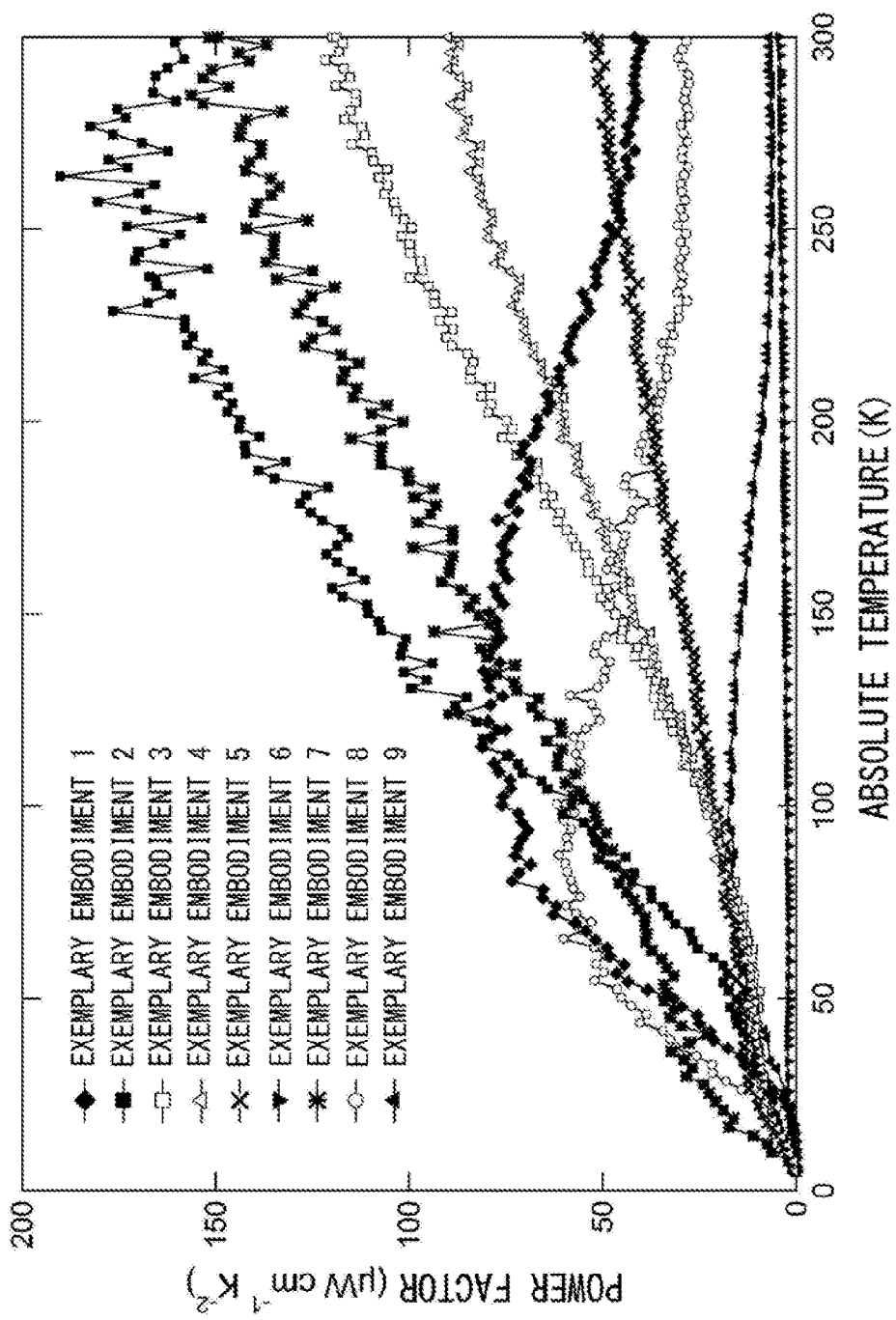
FIG. 4 is a graph showing the power factor relationship of the single crystal samples according to the exemplary embodiments 1 to 9.

As shown in FIG. 2, the samples according to the exemplary embodiments 1 to 8 had low electrical resistivity. As can be seen from FIG. 3, in the samples according to the exemplary embodiments 8 and 9, the thermoelectromotive force at 50 to 200K was −400 (μV/K) or less. Further, as shown in FIG. 4, the peak of the power factor was around 100 to 150K for the sample according to the exemplary embodiment 1 and around 100K for the exemplary embodiment 8. The value of each power factor was higher than 40 to 50 (μW/cmK$^2$) which was that of $Bi_2Te_3$ based materials currently in practical use. This indicates that the samples according to the exemplary embodiments 1 and 8 may exhibit high performance at such low temperatures. Further, the samples according to the exemplary embodiments 2 to 5 and 7 exhibited high power factors at a higher temperature compared to the exemplary embodiment 1. The $(Ta_{0.09}Mo_{0.01})_4SiTe_4$ sample according to the exemplary embodiment 6 and the $Ta_4Si(Te_{0.98}Sb_{0.02})_4$ sample according to the exemplary embodiment 9 exhibited power factors lower than those of the other exemplary embodiments.

Figure 5:
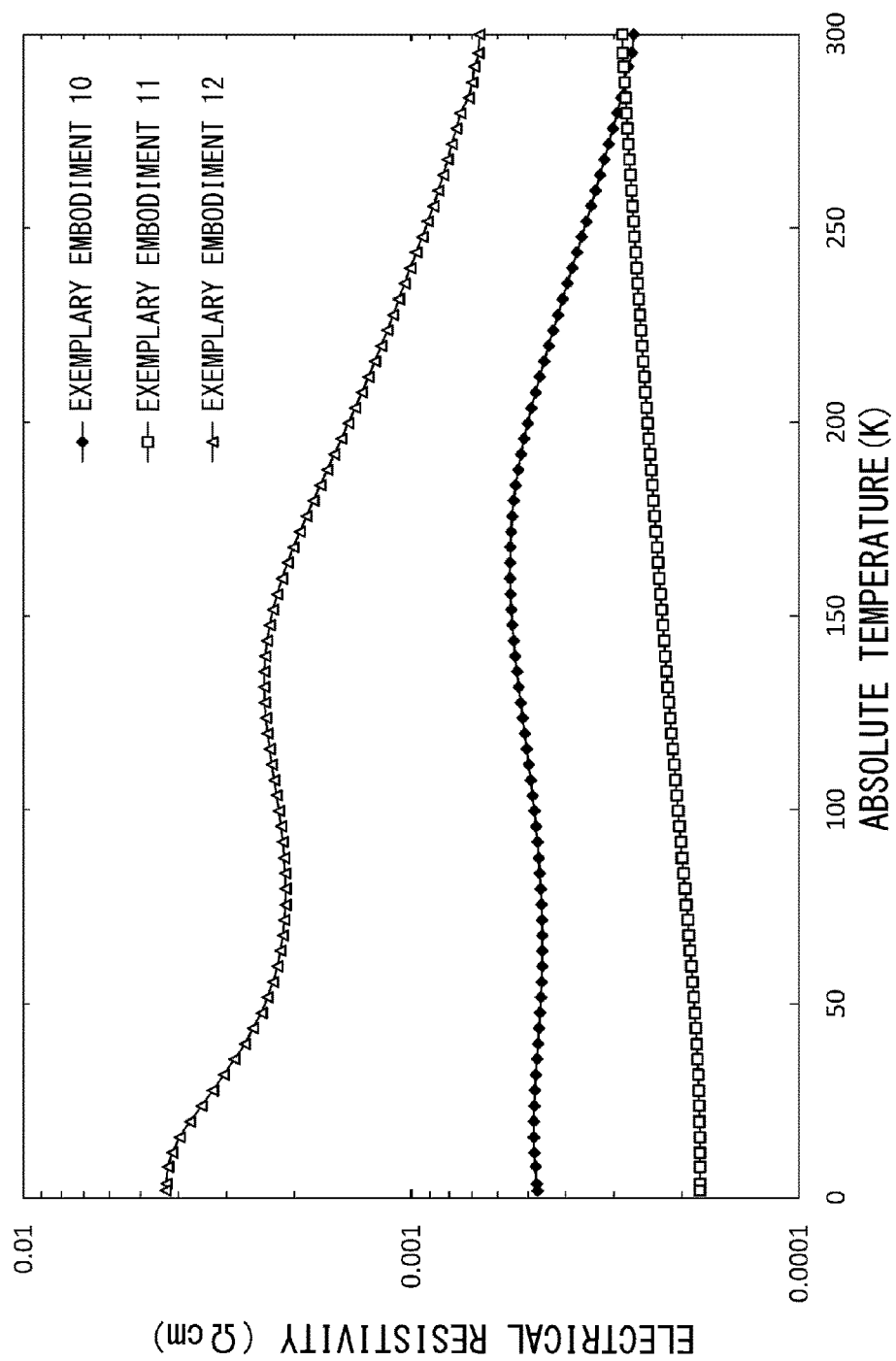
FIG. 5 is a graph showing the electrical resistivity of single crystal samples according to exemplary embodiments 10 to 12.
Figure 6:
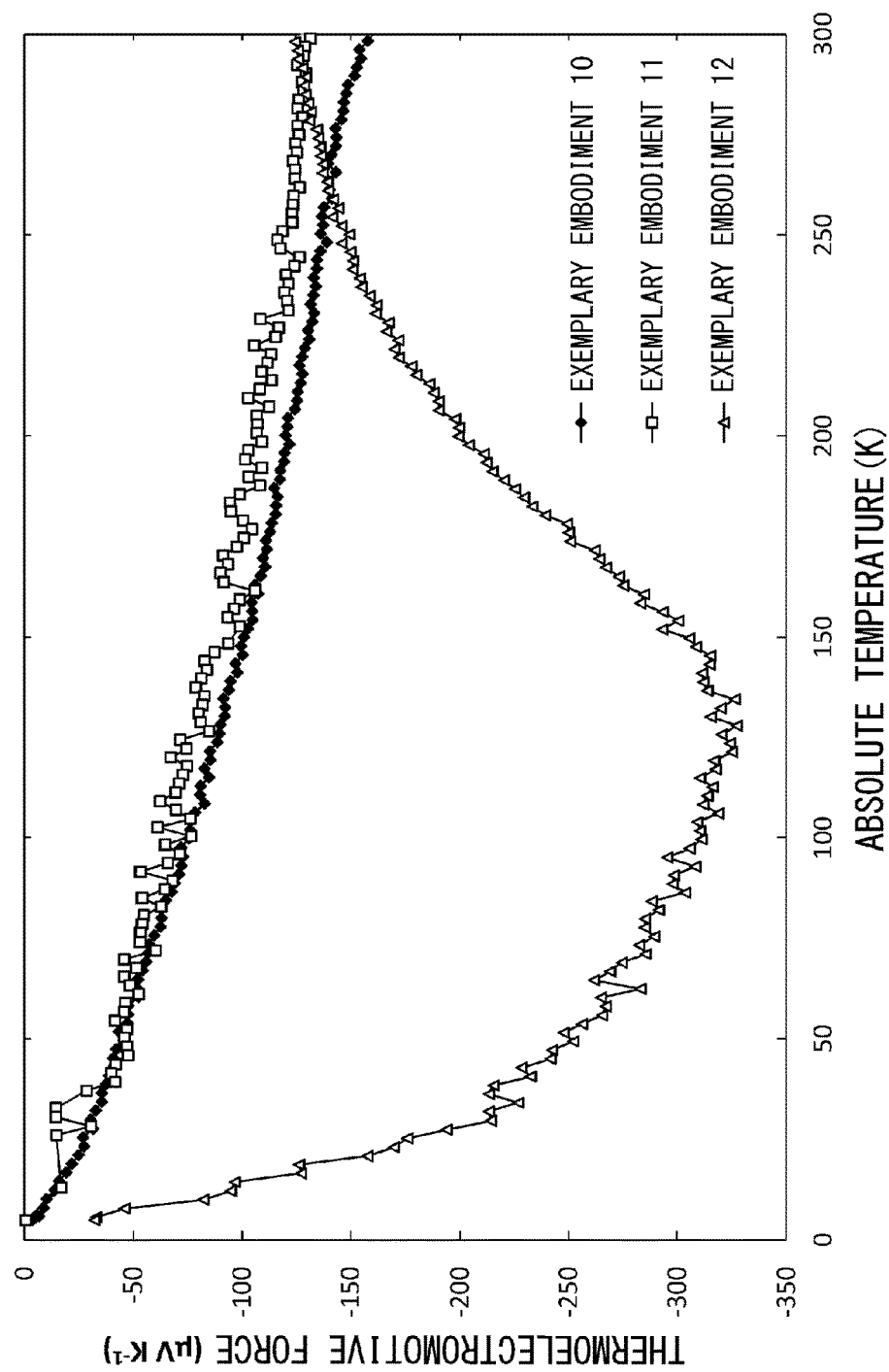
FIG. 6 is a graph showing the thermoelectromotive force of the single crystal samples according to the exemplary embodiments 10 to 12.
Figure 7:
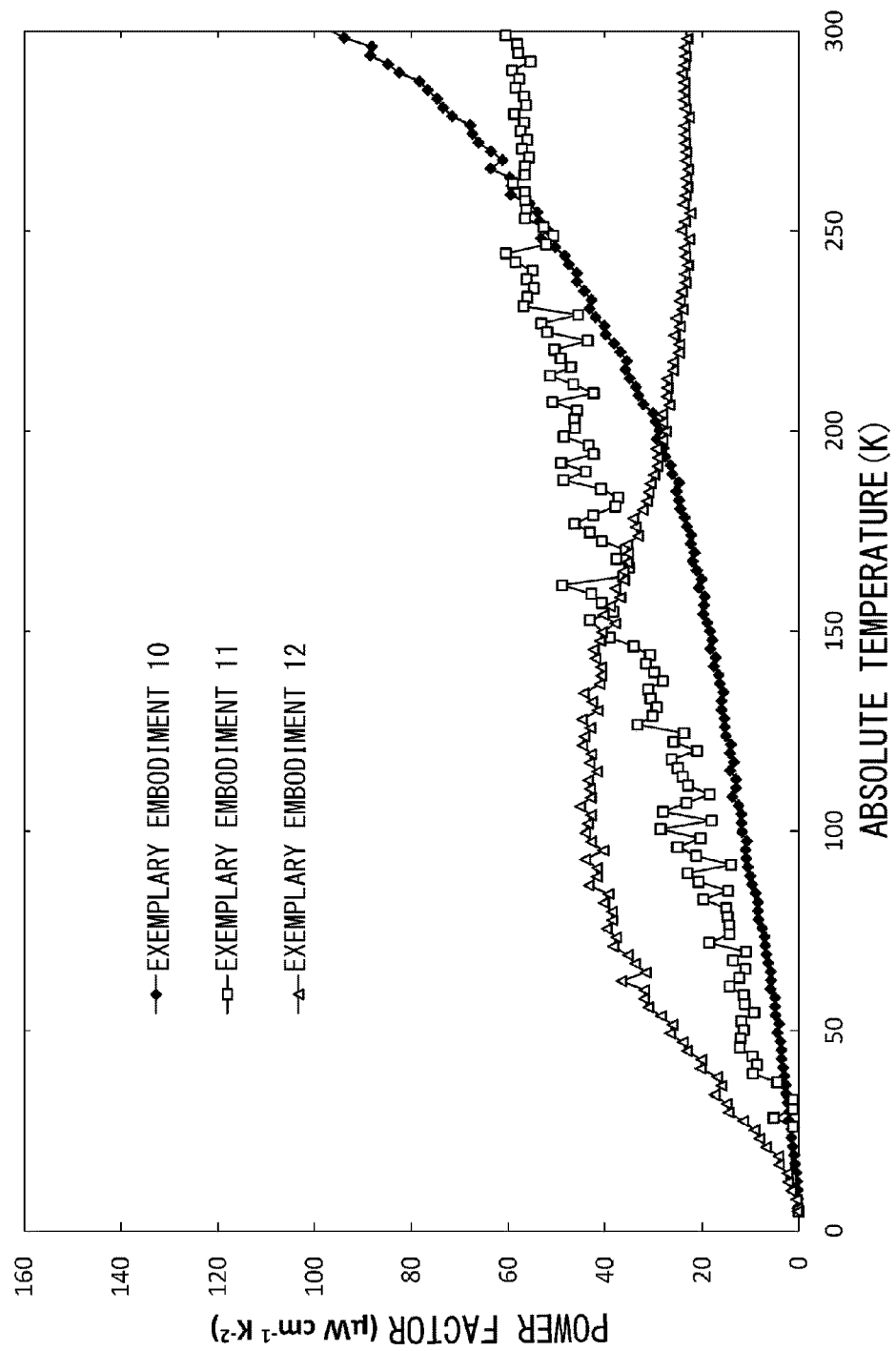
FIG. 7 is a graph showing power factors of the single crystal samples according to the exemplary embodiments 10 to 12.

As shown in FIG. 5, all the samples according to the exemplary embodiments 10 to 12 exhibited low electrical resistivity. As can be seen from FIG. 6, in the sample according to the exemplary embodiment 12, the thermoelectromotive force was −300 (μV/K) or less at approximately 100 to 150K. As shown in FIG. 7, the peak of the power factor of the sample according to the exemplary embodiment 12 was at around 100K. The peaks of the power factors of the $Nb_4SiTe_4$ sample according to the exemplary embodiment 10 and the $(Nb_{0.98}Mo_{0.02})_4SiTe_4$ sample according to the exemplary embodiment 11 were observed at a higher temperature compared to that of the exemplary embodiment 12.

Figure 8:
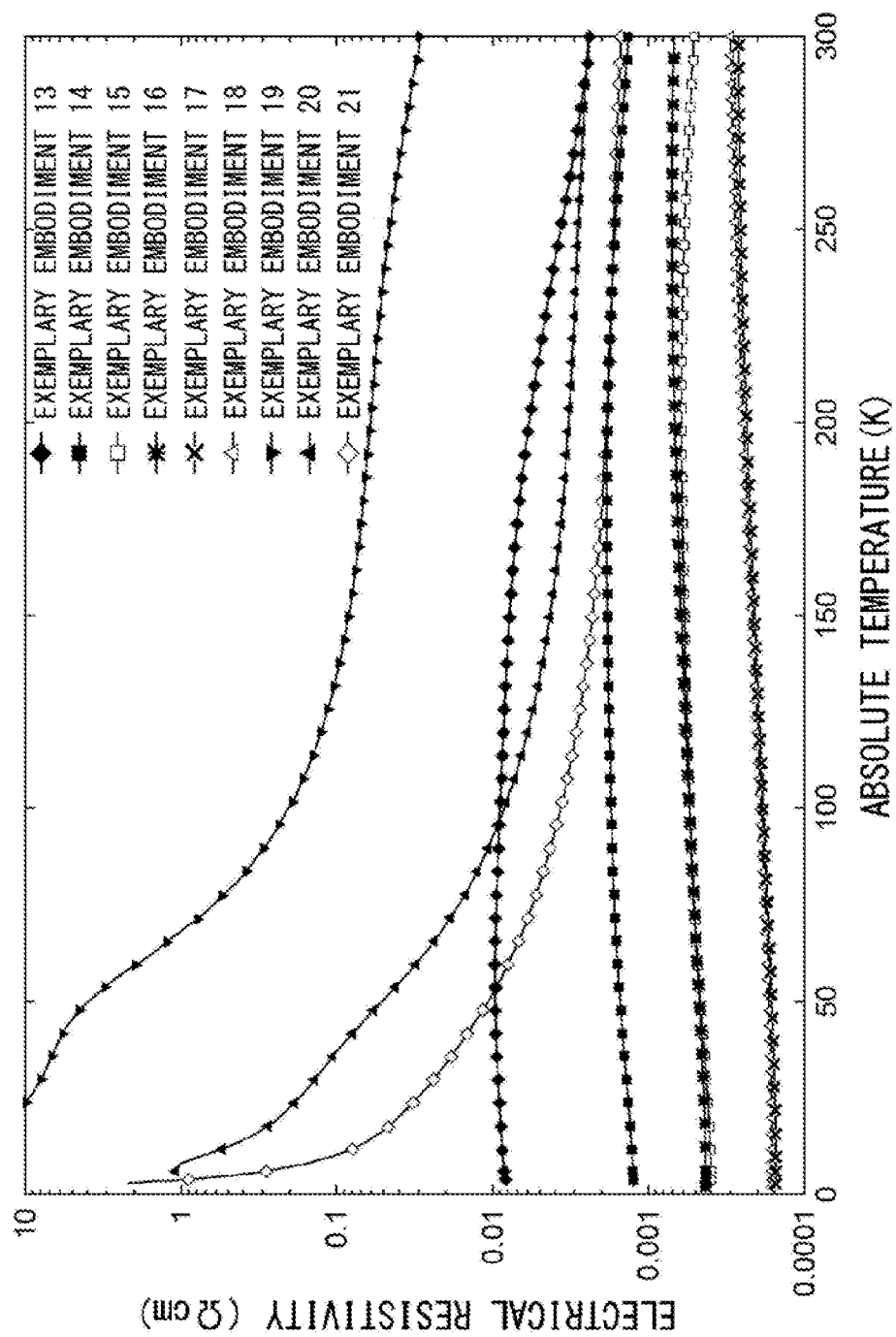
FIG. 8 is a graph showing the electrical resistivity of single crystal samples according to exemplary embodiments 13 to 21.
Figure 9:
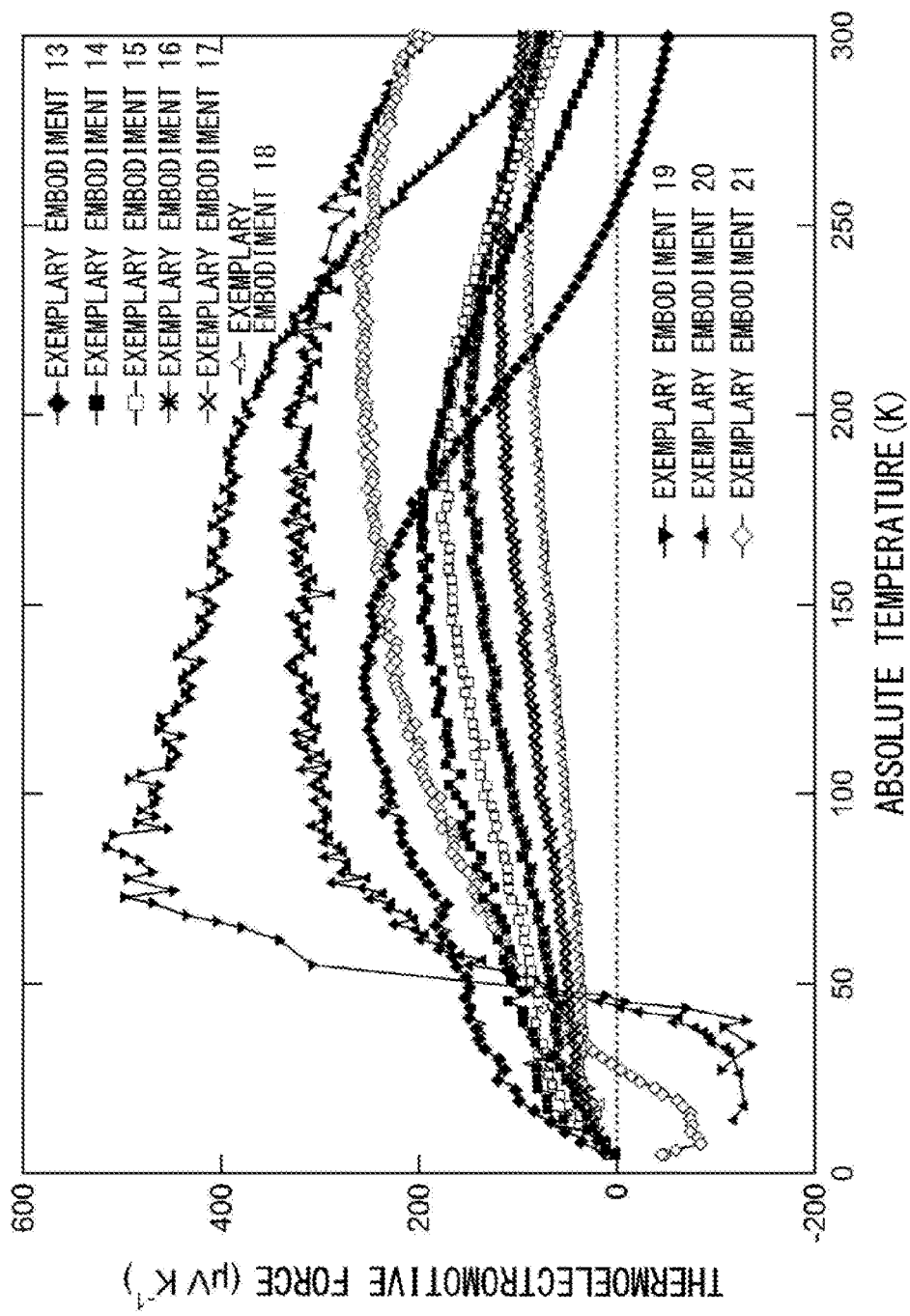
FIG. 9 is a graph showing the thermoelectromotive force of the single crystal samples according to the exemplary embodiments 13 to 21.
Figure 10:
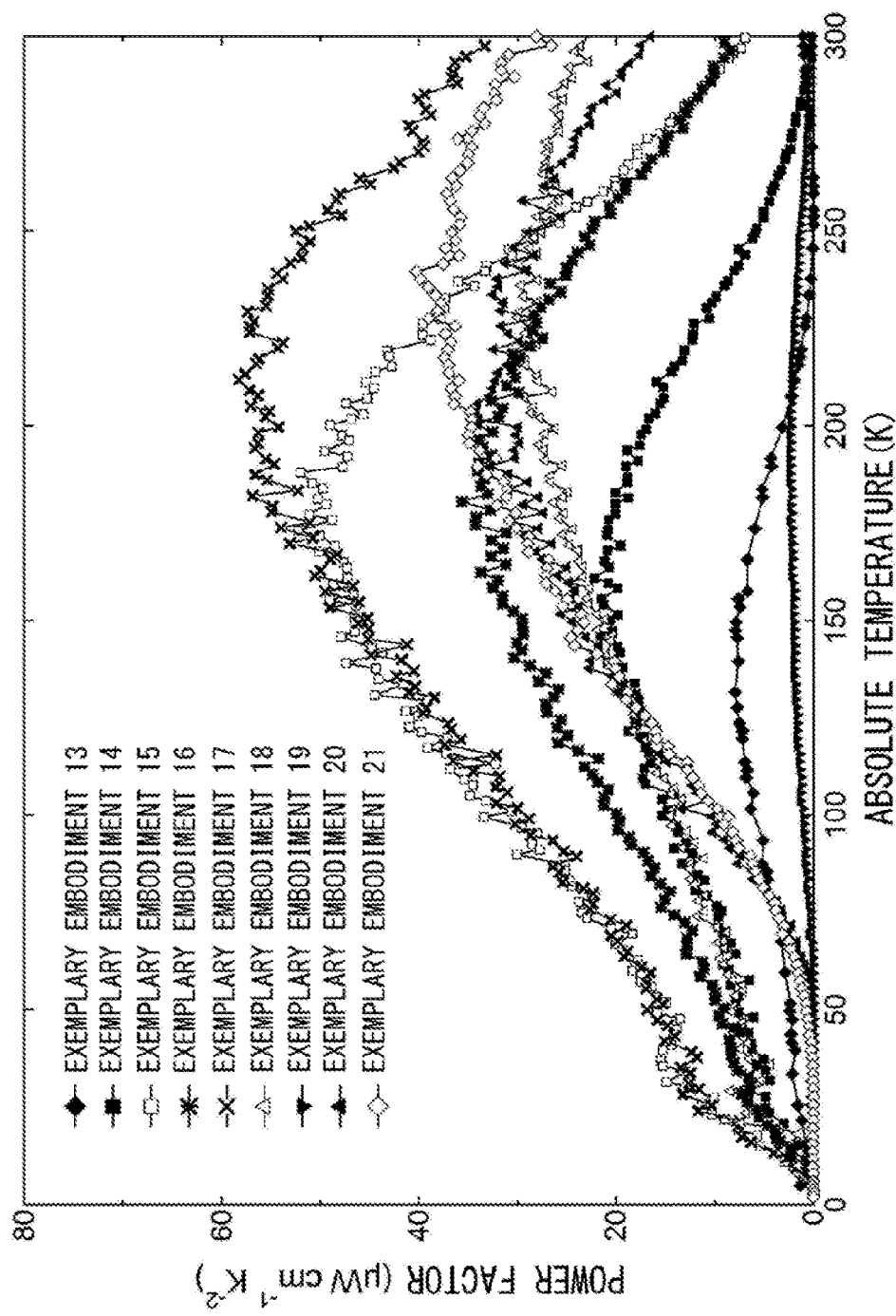
FIG. 10 is a graph showing power factors of the single crystal samples according to the exemplary embodiments 13 to 21.
Figure 11:
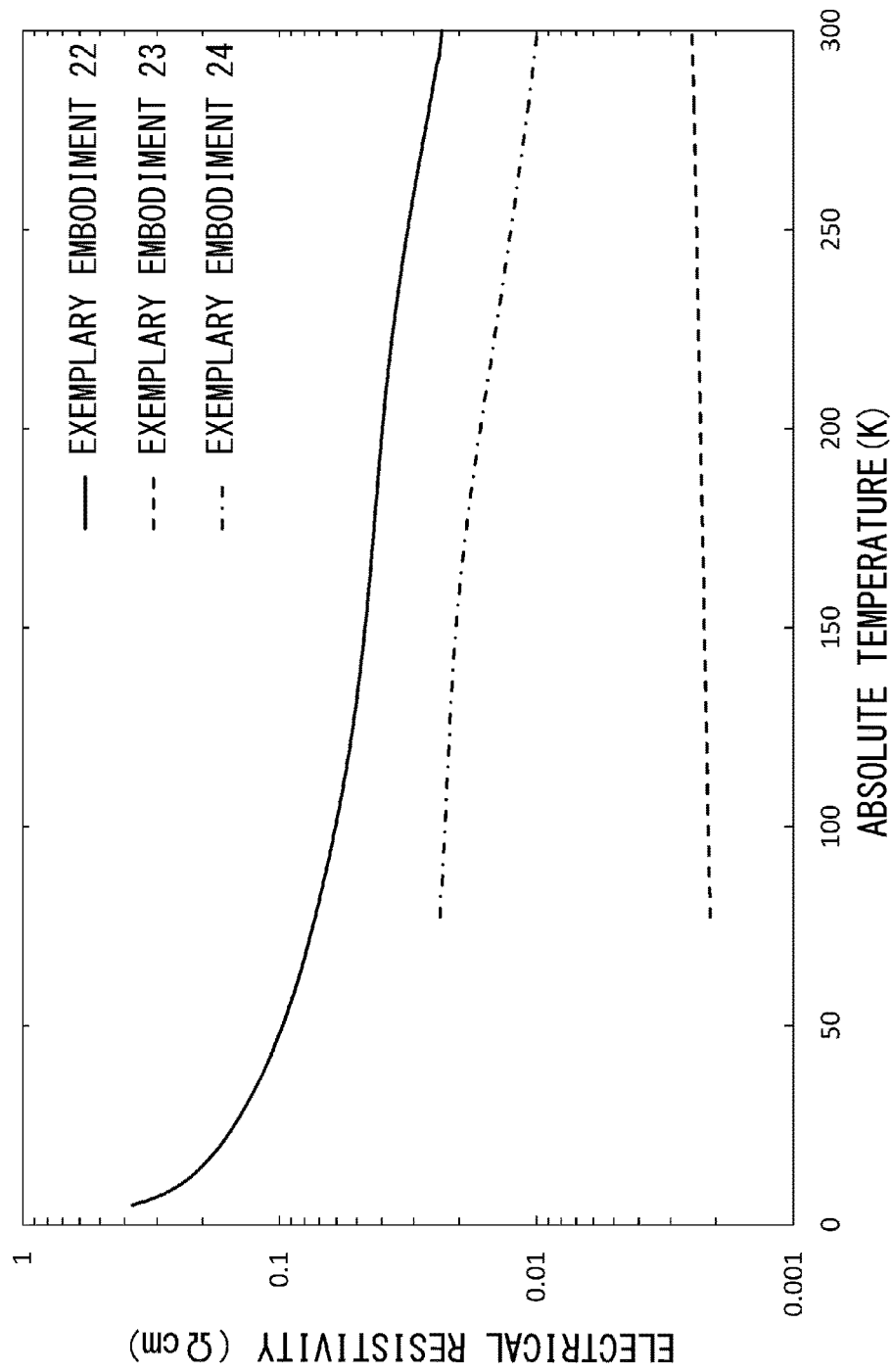
FIG. 11 is a graph showing the electrical resistivity of sintered compact samples according to exemplary embodiments 22 to 24.
Figure 12:
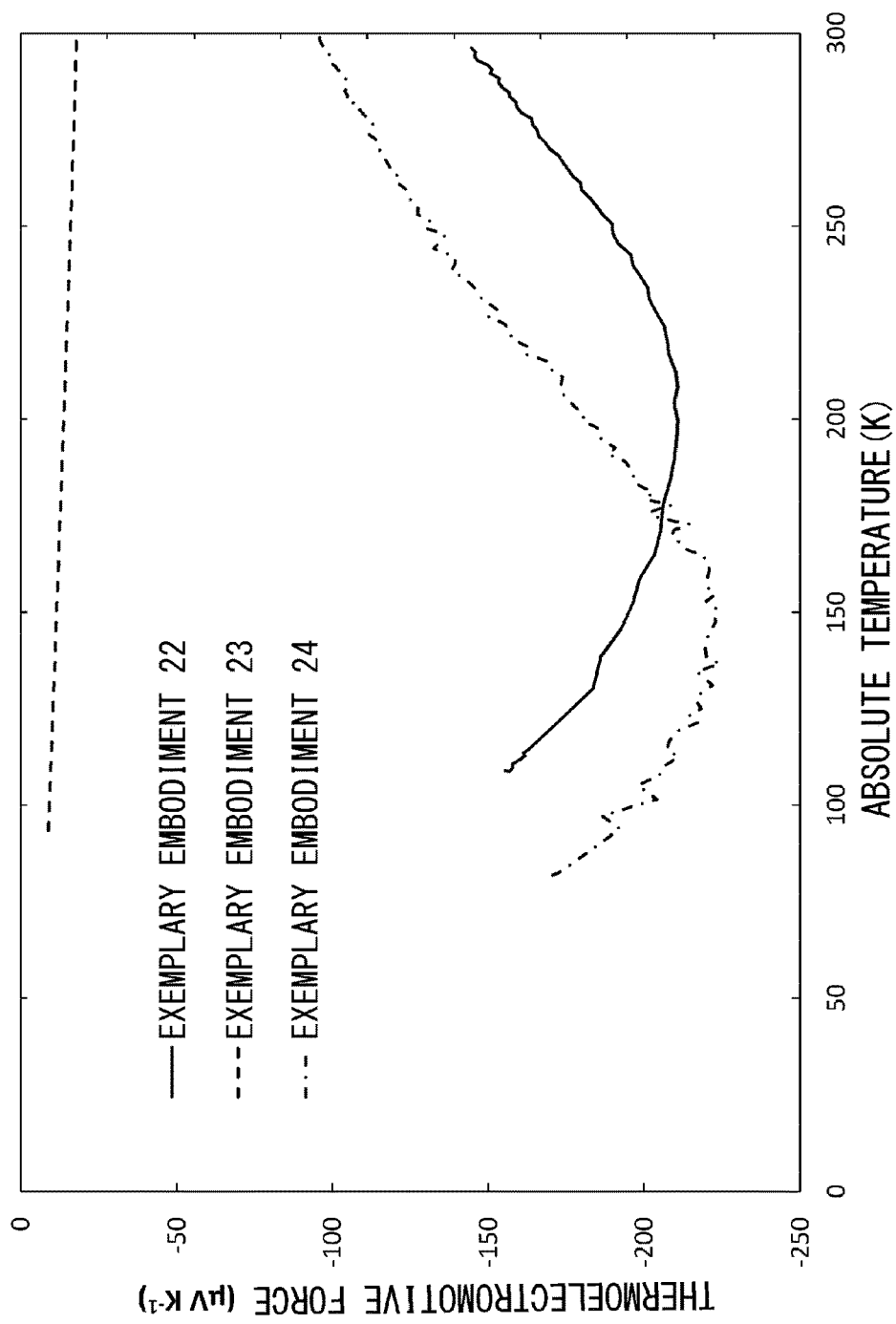
FIG. 12 is a graph showing the thermoelectromotive force of the sintered compact samples according to the exemplary embodiments 22 to 24.
Figure 13:
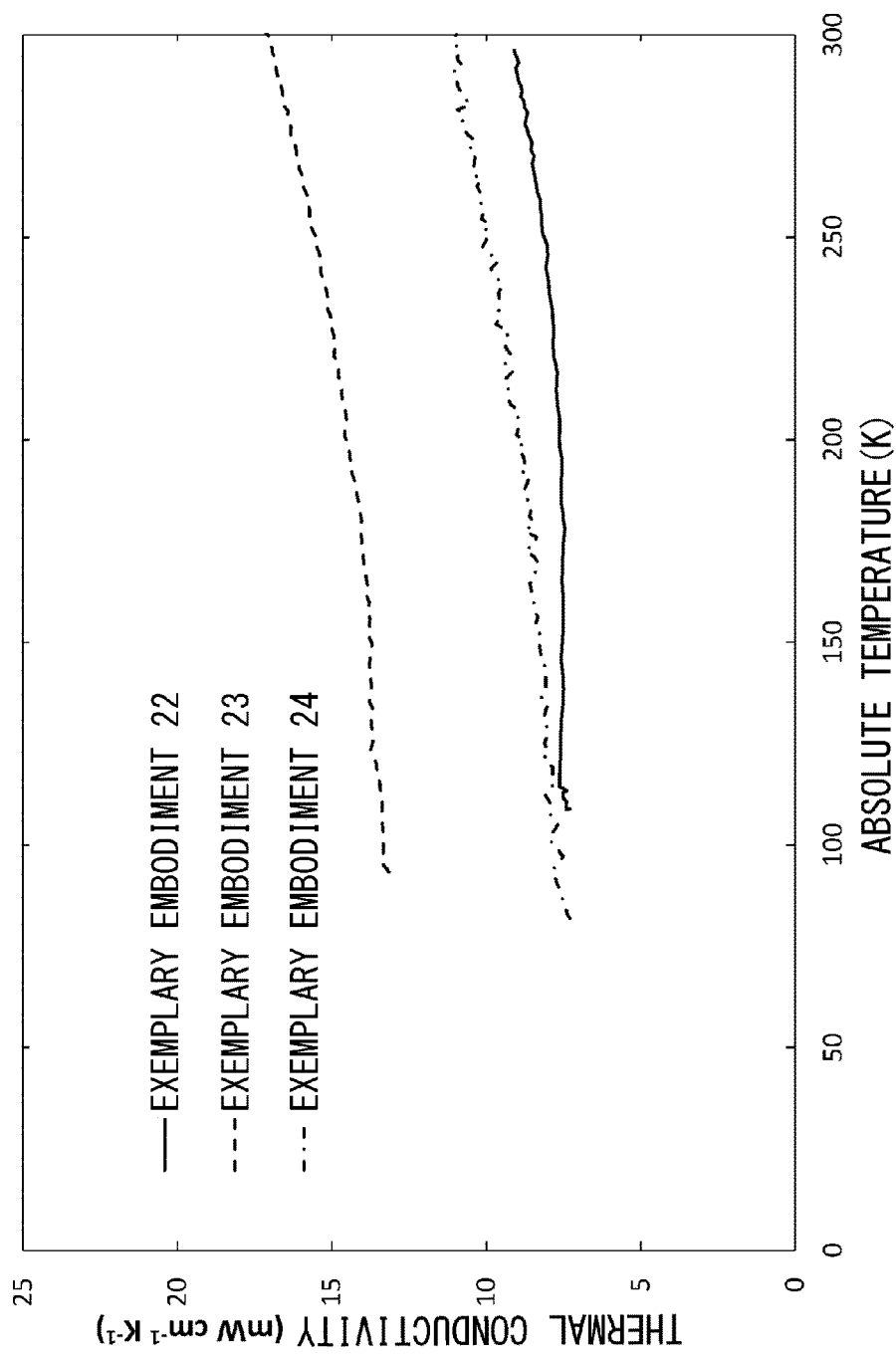
FIG. 13 is a graph showing the thermal conductivity of the sintered compact samples according to the exemplary embodiments 22 to 24.
Figure 14:
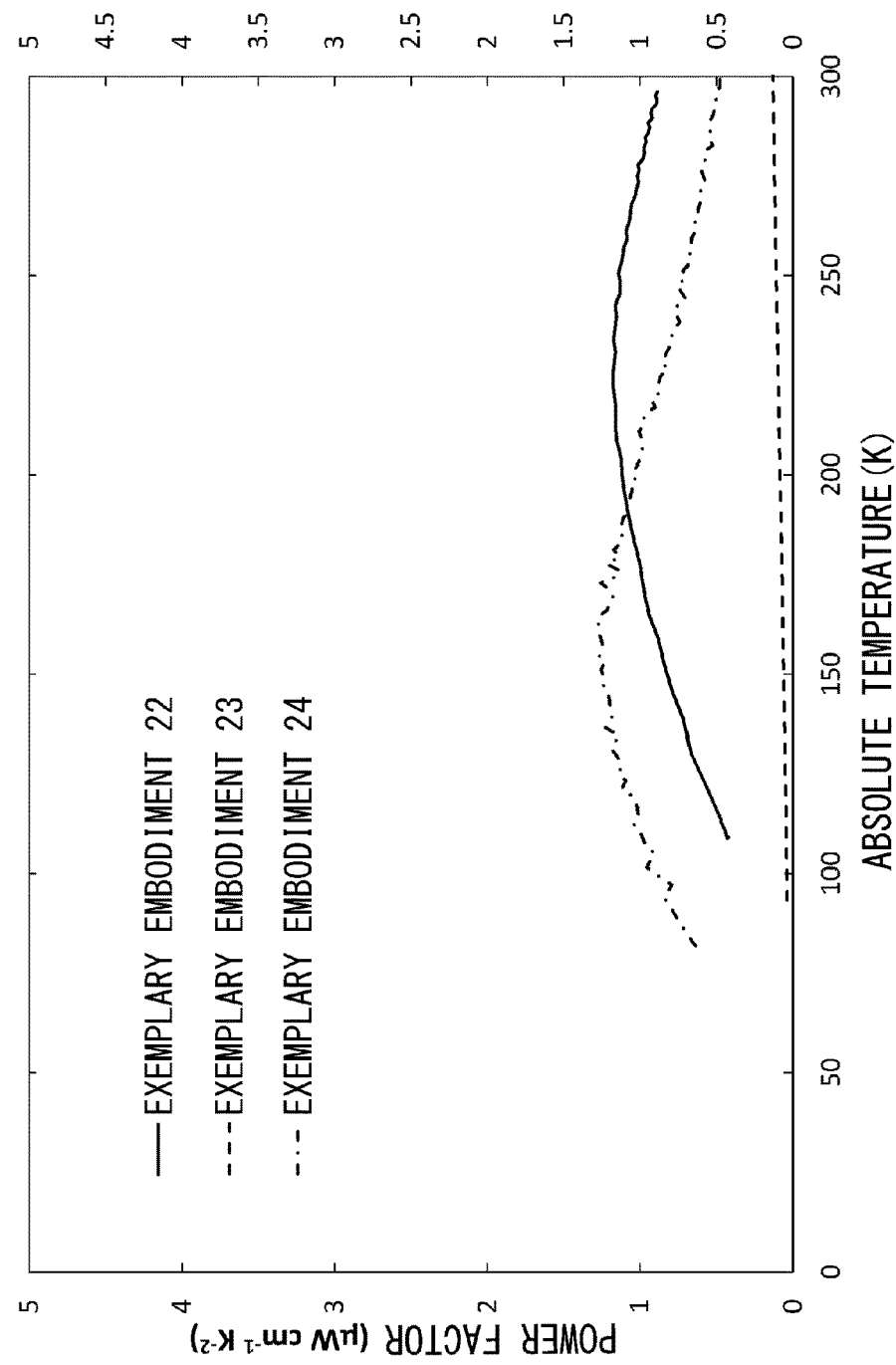
FIG. 14 is a graph showing power factors of the sintered compact samples according to the exemplary embodiments 22 to 24.
Figure 15:
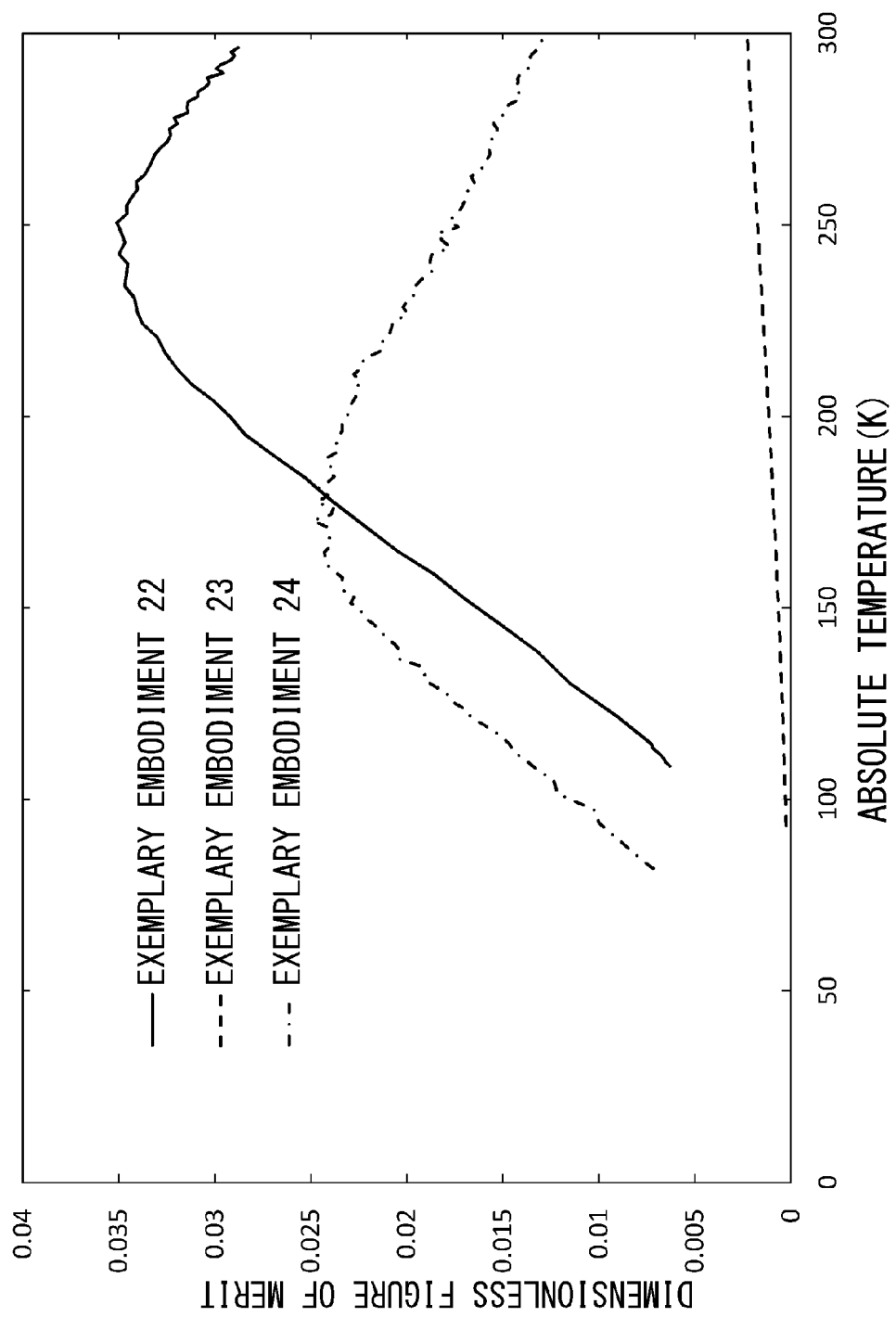
FIG. 15 is a graph showing the dimensionless figure of merit of the sintered compact samples according to the exemplary embodiments 22 to 24.

The measurement results for the electrical resistivity of the samples according to the exemplary embodiments 13 to 21 are shown in FIG. 8. As can be seen from FIG. 9, in the samples according to the exemplary embodiments 13 to 21 in which substitution with Ti was performed on $Nb_4SiTe_4$ or $Ta_4SiTe_4$, there was a temperature range where the thermoelectromotive force had a positive value. This indicates that these samples are p-type thermoelectric conversion materials within this temperature range. As shown in FIG. 10, the peaks of the power factors of these samples were observed at approximately 150 to 250K. In these samples, the $(Nb_{0.99}Ti_{0.01})_4SiTe_4$ sample according to the exemplary embodiment 15, the $(Nb_{0.98}Ti_{0.02})_4SiTe_4$ sample according to the exemplary embodiment 16, the $(Nb_{0.95}Ti_{0.05})_4SiTe_4$ sample according to the exemplary embodiment 17, and the $(Nb_{0.92}Ti_{0.08})_4SiTe_4$ sample according to the exemplary embodiment 18 exhibited a relatively high power factor.

As can be seen from FIGS. 11 to 15, the exemplary embodiments 22 to 24, which are polycrystalline samples, had a tendency to exhibit lower performance compared to the single crystal samples. This is considered to be due to the fact that crystal orientations were not aligned in these polycrystalline samples.

While the present disclosure has been described by referring to the above-described embodiments, the disclosure is not limited to the above-described embodiments, and the appropriate combination of the configurations of the embodiments or the substitution thereof is also included in the disclosure. Also, it is understood by those skilled in the art that various modifications such as changes in combination or the order of steps may be made as appropriate in each embodiment or changes in design may be added to the embodiments based on their knowledge, and the embodiments added with such modifications are also within the scope of the present disclosure.

What is claimed is:

1. A thermoelectric conversion material expressed by the following formula (1):

$$(M^1_{1-x}M^2_x)_4Si(Te_{1-y}M^3_y)_4 \qquad (1)$$

wherein $M^1$ represents Ta or Nb,
$M^2$ is at least one element selected from a group consisting of elements of groups 4 to 12 in the periodic table,
$M^3$ is at least one element selected from a group consisting of As, Sb, Bi, Sn and Pb,
$0<x<0.2$ and $0\leq y<0.2$ are satisfied, or $0\leq x <0.2$ and $0<y<0.2$ are satisfied, and
$M^2$ is an element different from $M^1$ when $0<x$.

2. The thermoelectric conversion material according to claim 1, wherein $0<y$, and $M^3$ represents Sb.

3. The thermoelectric conversion material according to claim 1, wherein $M^3$ represents Sb, and $0<y<0.1$.

4. The thermoelectric conversion material according to claim 3, wherein the thermoelectromotive force at 100K is −300 (μV/K) or less.

5. The thermoelectric conversion material according to claim 3, wherein the power factor thereof is maximum in a range of 50 to 150K.

6. The thermoelectric conversion material according to claim 1, wherein $0<x$, and $M^2$ represents Mo or W.

7. The thermoelectric conversion material according to claim 1, wherein $M^2$ represents Mo or W, and $0<x<0.1$.

8. A thermoelectric conversion element comprising an n-type thermoelectric conversion material and a p-type thermoelectric conversion material, wherein at least one of the n-type thermoelectric conversion material and the p-type thermoelectric conversion material is the thermoelectric conversion material according to claim 1.

9. The thermoelectric conversion material according to claim 4, wherein the power factor thereof is maximum in a range of 50 to 150K.

10. A thermoelectric conversion material expressed by the following formula (1-1):

$$(M^1_{1-x}M^2_x)_4Si(Te_{1-y}M^3_y)_4 \qquad (1-1)$$

wherein $M^1$ represents Ta or Nb,
$M^2$ represents Mo, W, or Ti,
$M^3$ represents Sb, and
$0<x<0.2$ and $0\leq y<0.2$ are satisfied, or $0\leq x <0.2$ and $0<y<0.2$ are satisfied.

11. A thermoelectric conversion material expressed by the following formula (1-2):

$$(Ta_{1-x}M^2_x)_4SiTe_4 \qquad (1-2)$$

wherein $M^2$ represents Mo or W, and
$0<x\leq 0.02$.

12. A thermoelectric conversion material expressed by the following formula (1-3):

$$(Nb_{1-x}Ti^2_x)_4SiTe_4 \qquad (1\text{-}3)$$

wherein, $0.01 \leq x \leq 0.08$.